United States Patent [19]

Sandhu et al.

[11] Patent Number: 5,196,353
[45] Date of Patent: Mar. 23, 1993

[54] METHOD FOR CONTROLLING A SEMICONDUCTOR (CMP) PROCESS BY MEASURING A SURFACE TEMPERATURE AND DEVELOPING A THERMAL IMAGE OF THE WAFER

[75] Inventors: Gurtej S. Sandhu; Trung T. Doan, both of Boise, Id.

[73] Assignee: Micron Technology, Inc., Boise, Id.

[21] Appl. No.: 817,474

[22] Filed: Jan. 3, 1992

[51] Int. Cl.$^5$ .................................. H01L 21/66
[52] U.S. Cl. ............................. 437/8; 437/228; 156/636; 51/131.4
[58] Field of Search ............ 437/8, 228; 51/131.4; 156/636

[56] References Cited

U.S. PATENT DOCUMENTS

| | | | |
|---|---|---|---|
| 3,841,031 | 10/1974 | Walsh | 51/283 |
| 4,193,226 | 3/1980 | Gill, Jr. et al. | 51/124 |
| 4,450,652 | 5/1984 | Walsh | 51/131.4 |
| 4,702,792 | 10/1987 | Chow et al. | 156/643 |
| 4,811,522 | 3/1989 | Gill, Jr. | 51/131.1 |
| 4,992,135 | 2/1991 | Doan | 437/228 |
| 5,036,015 | 7/1991 | Sandhu et al. | 437/8 |

OTHER PUBLICATIONS

Vipul Patel, Walter Kosonocky, A. Ayyagari and Mehul Patel, Application of Thermal Imaging Methodology for Plasma Etching Diagnosis, SPIE Technical Symposium on Microelectronic Processing Integration '91, Sep. 1991.

Primary Examiner—Brian E. Hearn
Assistant Examiner—Laura M. Holtzman
Attorney, Agent, or Firm—Stephen A. Gratton

[57] ABSTRACT

A method and apparatus for controlling a chemical mechanical planarization (CMP) process in semiconductor manufacture includes an infrared camera for detecting and mapping a temperature of the wafer for developing a thermal image of the wafer. The thermal image can then be analyzed and used to control the operational parameters of the (CMP) process such as time, temperature, and downward pressure, in order to enhance the uniformity of polishing across the wafer. In addition, it can be used to end-point the (CMP) process by detecting sudden changes in the wafer surface temperature as one layer is completely polished away exposing an underlying layer of a different material.

7 Claims, 2 Drawing Sheets

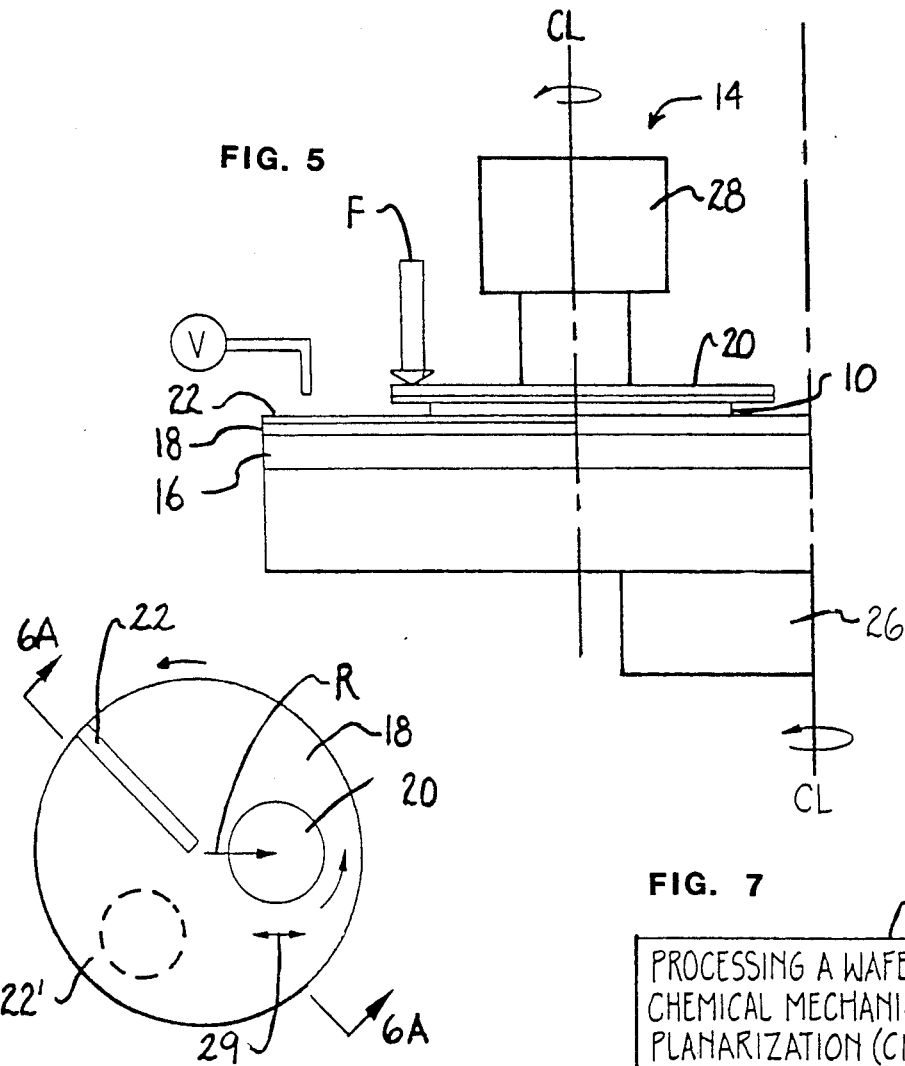
FIG. 5
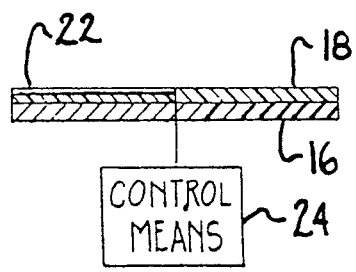
FIG. 6
FIG. 6A
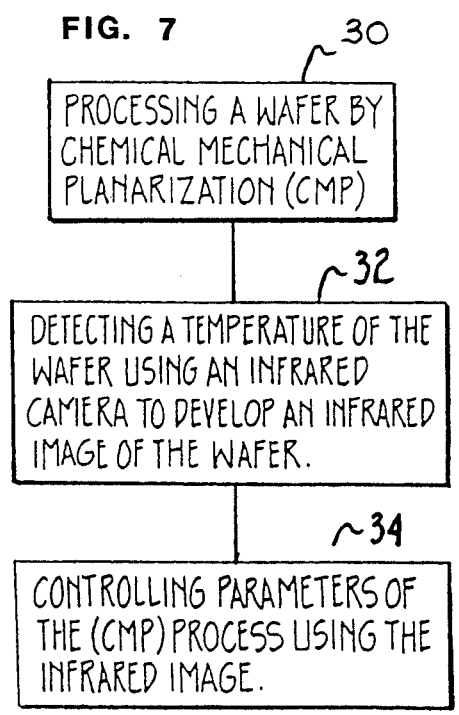
FIG. 7

METHOD FOR CONTROLLING A SEMICONDUCTOR (CMP) PROCESS BY MEASURING A SURFACE TEMPERATURE AND DEVELOPING A THERMAL IMAGE OF THE WAFER

TECHNICAL FIELD

This invention relates to semiconductor manufacture and, more particularly, to a novel method and apparatus for controlling a chemical mechanical planarization (CMP) process in real time by measuring and mapping the surface temperature of a semiconductor wafer during (CMP) to form an infrared image of the wafer.

BACKGROUND OF THE INVENTION

In semiconductor manufacture, extremely small electronic devices are formed in separate dies on a thin, flat semiconductor wafer. The separate dies or chips are then separated from the wafer and packaged to form different types of IC chips. In general, various materials which are either conductive, insulating, or semiconducting are utilized to form the electronic devices. These materials are patterned, doped with impurities, or deposited in layers by various processes to form the integrated circuits. A completed circuit device is referred to as an integrated circuit (IC).

One process that is utilized in the fabrication of integrated circuits (ICs) is referred to as chemical mechanical planarization (CMP). In general, chemical mechanical planarization (CMP) involves holding or rotating a thin, flat wafer of semiconductor material on which ICs have been formed en masse against a wetted polishing surface. A chemical slurry containing a polishing agent such as alumina or silica is typically utilized as the abrasive medium. Additionally, the chemical slurry may contain chemical etchants for etching various surfaces of the wafer.

In general, a semiconductor wafer may be subjected to chemical mechanical planarization (CMP) to planarize the wafer and to remove topography. A (CMP) process may also be used to remove different layers of material and various surface defects such as crystal lattice damage, scratches, roughness, or embedded particles of dirt or dust. The (CMP) process thus improves the quality and reliability of the integrated circuits (ICs) formed on the wafer.

In the chemical mechanical planarization (CMP) process, a rotating polishing head or wafer carrier, is typically utilized to hold the wafer under controlled pressure against a rotating polishing platen. Other process parameters such as time, temperature, and the composition and flow rate of the chemical slurry are also closely controlled. The polishing platen is typically covered with a relatively soft, pad material such as blown polyurethane. The chemical slurry is dispensed onto the polishing platen and is selected to provide an abrasive medium and chemical activity for the etching.

Such apparatus for polishing thin, flat semiconductor wafers are well known in the art. U.S. Pat. Nos. 4,193,226 and 4,811,522 to Gill, Jr. and U.S. Pat. No. 3,841,031 to Walsh, for instance, disclose such apparatus. Another such apparatus is manufactured by Westech Engineering and designated as a Model 372 Polisher.

A particular problem encountered during a chemical mechanical planarization (CMP) process is in the control of the various process parameters to achieve the desired wafer characteristics. It may be desirable for instance, to achieve a particular surface smoothness or roughness or to planarize the wafer to a desired planar endpoint. As an example, it may be useful to remove a thickness of oxide material which has been deposited onto a substrate on which a variety of integrated circuit devices have been formed. In removing or planarizing this oxide, it may be necessary to remove the oxide to the top of the various integrated circuit devices without removing any portion of a device.

In the past, it has not been possible to monitor the characteristics of the wafer during the (CMP) process. The surface characteristics and planar endpoint of the planarized wafer surface have typically been detected by mechanically removing the semiconductor wafer from the (CMP) apparatus and physically examining the semiconductor wafer using instruments and techniques which ascertain dimensional and planar characteristics. Measurement instruments include surface profilometers, ellipsometers, and quartz crystal oscillators. If the semiconductor wafer does not meet specifications, it must be loaded back into the (CMP) apparatus and planarized again. This is a time consuming and labor intensive procedure. In addition, an excess of material may have been removed from the semiconductor wafer rendering the part as unusable. There is therefore a need in the art for a process for monitoring the characteristics of a semiconductor wafer during the (CMP) process in order to insure the uniformity of the (CMP) process with respect to a single wafer and from wafer to wafer.

One prior art patent, U.S. Pat. No. 5,036,015, to Sandhu et al, which is assigned to the assignee of the present application, discloses an in-situ process for detecting a planar endpoint during the chemical mechanical planarization (CMP) process. In this process a change of friction between the wafer surface and polishing platen are sensed by measuring a load change on the drive motors for the chemical mechanical planarization apparatus. A change of friction may occur for example at the planar endpoint which separates different film layers on a wafer. While this process is effective for determining a planar endpoint on a wafer, it cannot be used to effect a continuous real time evaluation of the wafer in order to control the parameters of the chemical mechanical planarization (CMP) process.

One technique that has recently been adapted in semiconductor manufacture for controlling some fabrication processes is known as thermal imaging. In general, thermal imaging involves the remote sensing of temperature across the wafer using techniques such as pyrometry, fluoroptic thermometry, and laser interferometric thermometry. The technical article of reference [1] discloses a method of thermal imaging using an infrared TV camera for measuring the spatial temperature variation across the wafer. This information is then used to control the plasma etching process in real time.

The present invention is directed to a novel method and apparatus for controlling a semiconductor chemical mechanical planarization (CMP) process in real time by thermal imaging of the semiconductor wafer during the (CMP) process. This process is especially useful for insuring the uniformity of the (CMP) process with respect to a wafer.

SUMMARY OF THE INVENTION

In accordance with the present invention, a novel method and apparatus for controlling a semiconductor chemical mechanical planarization (CMP) process in real time by measuring the temperature of the wafer is provided. In general, the method and apparatus of the invention senses or maps the temperature of the wafer during the chemical mechanical planarization (CMP) process to provide a thermal image that can be analyzed for controlling the operational parameters of the chemical mechanical planarization (CMP) process. The method and apparatus of the invention is adapted to enhance the uniformity of the (CMP) process across a wafer and the uniformity of the (CMP) process from wafer to wafer. In addition the method and apparatus of the invention can be used to detect end points on the wafer by detecting a temperature differential that may occur as one layer is removed and another layer is contacted.

It is known that during the (CMP) process, due to friction between the wafer and polishing pad, the temperature of the surfaces rises. For example, a temperature rise of a few tens of degrees (° F.) is commonly seen during the (CMP) process at the wafer/pad interface. This rise in temperature is largely dependent on the frictional force at the wafer-pad interface. By mapping the temperature on the surface of the wafer, a polish rate at various points on the wafer surface can be mapped. This information can then be used to modify the operational parameters of the (CMP) process (such as time, temperature, rotational speed, wafer backside pressure, down force, polishing slurry flow, etc.) to improve the uniformity of the (CMP) process in-situ. In this way the uniformity of wafer polishing can be monitored and controlled in real time. In an illustrative embodiment of the invention the surface temperature of the wafer is measured and mapped utilizing an infrared detection means such as an infrared camera mounted to the polishing plante.

Other objects, advantages, and capabilities of the present invention will become more apparent as the description proceeds.

BRIEF DESCRIPTION OF THE DRAWINGS

FIG. 5 is a schematic elevation view of a chemical mechanical planarization (CMP) apparatus for use in accordance with the method of the invention;

FIG. 6 is a schematic plan view of a polishing pad and platen component of the apparatus of FIG. 5 having a temperature detectin means in the form of an infrared camera mounted thereon; FIG. 6A is a schematic cross section taken along section line 6A—6A of FIG. 6; and FIG. 7 is a block diagram of a method for controlling a (CMP) process in accordance with the invention.

DESCRIPTION OF PREFERRED EMBODIMENTS

A semiconductor wafer typically includes a substrate on which a plurality of IC devices or other structural features have been formed. The wafer substrate is typically formed of a single crystal silicon material. The IC devices or other structural features are typically formed by patterning regions and layers on the substrate. A chemical mechanical planarization (CMP) process may be utilized, for instance, to remove a portion of a layer or specific structural feature from the wafer. Additionally, different layers on the wafer are generally formed of different materials and it may be necessary to remove a portion of a layer such as a layer of oxide to a planar endpoint.

Figure 1:
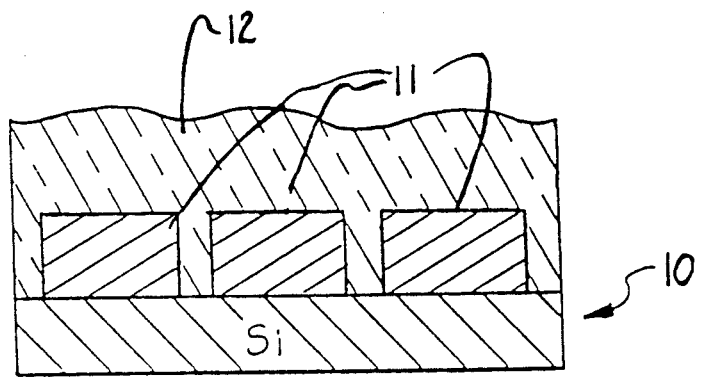
FIG. 1 is an enlarged side elevation view of a portion of a semiconductor wafer prior to chemical mechanical planarization (CMP)
Figure 2:
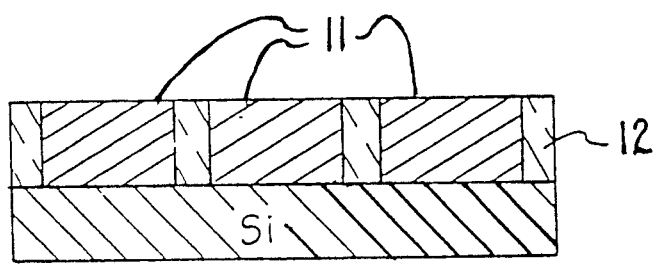
FIG. 2 is an enlarged side elevation view of a portion of a semiconductor wafer after chemical mechanical planarization (CMP)

With reference to FIG. 1 a semiconductor wafer 10 is shown as having a plurality of IC devices 11 formed thereon. An insulating or oxide coating 12 has been formed or deposited on a silicon substrate and over the IC devices 11. As an example, and as shown in FIG. 2, it may be necessary to remove the oxide coating 12 to the level of the IC devices 11 to form insulating spacers between the IC devices 11. This can be accomplished by a chemical mechanical planarization (CMP) process. This is just one example however, as other semiconductor manufacturing processes such as polishing, roughening, or thinning the wafer may also involve chemical mechanical planarization (CMP).

Figures 3, 4:
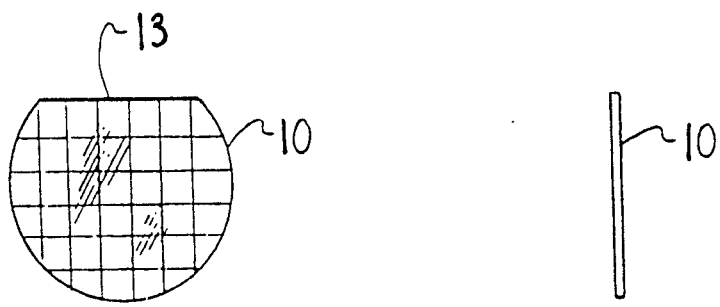
FIG. 3 is a schematic plan view of a semiconductor wafer.
FIG. 4 is a side elevation view of FIG. 3.

In general, a chemical mechanical planarization (CMP) process involves mechanically polishing a thin, flat semiconductor wafer by holding and rotating the wafer against a polishing platen under controlled parameters (such as rotational speed, down force, pressure, temperature, time, and chemical conditions). Such a semiconductor wafer is shown schematically in FIGS. 3 and 4 and is generally designated as 10. As shown, the wafer is generally circular in shape and includes a major flat 13. The size of the wafer 10 is typically about 6 inches in diameter but the wafer 10 may be smaller or larger. A plurality of patterned dies are formed on the surface of the wafer, each having a micro topography. The micro topography of each patterned die can be altered as illustrated by the example of FIGS. 1 and 2 by the mechanical planarization process.

In general, during the chemical mechanical planarization (CMP) process heat is developed as a result of friction between the wafer surface and the rotating polishing platen. The temperature of the wafer surface thus rises. This rise in temperature is dependent on the polishing pressure or down force on the wafer and on the coefficient of friction between the polishing platen and wafer surface. By mapping the temperature of the wafer during the (CMP) process a thermal image of the wafer can be developed and used to control the parameters of the (CMP) process. The uniformity of the chemical mechanical planarization (CMP) process can thus be accurately controlled. A uniform (CMP) process allows wafers to be consistently and efficiently manufactured with a high yield.

The uniformity of the (CMP) process can also be enhanced by accurate end point detection during the (CMP) process. In general, different layers of the semiconductor wafer are formed of different materials (i.e. metallic film, polysilicon film, insulators) which have a different relative hardness. The IC devices 11 formed in FIGS. 1 and 2, for instance, are generally harder than the oxide coating 12 formed on the IC devices I1. During the (CMP) process a coefficient of friction between the wafer 10 and the polishing platen and specifically the polishing platen pad may change as a result of contact with a different layer on the wafer surface. A temperature differential will thus occur. A temperature differential may also exist between different portions of the wafer formed of different materials. In addition to use in developing a thermal image of the wafer developed during the (CMP) process, such temperature differentials can be used to detect planar end points on the wafer.

The method of the invention then, broadly stated, includes the steps of chemically mechanically planarizing a wafer while simultaneously detecting a temperature of the wafer to develop a thermal image which can be analyzed to control the (CMP) process parameters. In an illustrative embodiment of the invention, a preferred method of detecting and mapping the temperature of the wafer to develop a thermal image is with an infrared detection means such as an infrared camera. The infrared detection means may be conveniently mounted on a polishing platen associated with the (CMP) apparatus.

Referring now to FIG. 5, a chemical mechanical planarization (CMP) apparatus constructed in accordance with the invention and illustrating the method of the invention is shown and generally designated as 14. The chemical mechanical planarization (CMP) apparatus 14 includes:

polishing means in the form of a rotatable polishing platen 16 having a polishing pad 18 mounted thereon;

holding means for holding the semiconductor wafer 10 in the form of a rotatable polishing head or wafer carrier 20 adapted for holding and rotating the wafer 10 against the polishing platen 16 and polishing pad 18 under a controlled downward pressure or force (F); and temperature detection means in the form of an infrared camera 22 mounted to the polishing platen 16 and adapted to sense and map a temperature of the wafer for developing a thermal image of the wafer 10 during chemical mechanical planarization (CMP) of the wafer.

As shown in FIG. 6, a direction of rotation of the polishing platen 16 and wafer carrier 20 is preferably the same (i.e. CCW). Alternately, the polishing platen 16 and wafer carrier 20 may be rotated in opposite directions. A drive motor 26 (FIG. 5) rotates the polishing platen and a drive motor 28 (FIG. 5) rotates the wafer carrier 20. Additionally, the wafer carrier 20 is constructed to move across the polishing platen 16 as indicated by the double headed arrow 29 in FIG. 6. The wafer carrier 20 may include means for holding the backside of the wafer such as a vacuum holding means, at a preselected backside pressure (not shown).

The polishing agent is dispensed as shown in FIG. 5 through a suitable valved conduit onto the surface of the polishing pad 18 of the polishing platen 16. Such mechanical planarization apparatus are well known in the art. One such apparatus is manufactured by Westech Engineering and designated as a Model 372 Polisher.

In general, with such chemical mechanical planarization apparatus 14, all process parameters (rotational speed, force (F), temperature, slurry, chemical components) are under computer control.

In general, the apparatus 14 of the invention adds temperature detection means, an infrared camera 22, to the chemical mechanical planarization apparatus 14 of the prior art in order to detect the heat of the wafer 10 during the (CMP) for developing a thermal image that can be analyzed to control the parameters of the chemical mechanical planarization (CMP) process.

With reference to FIG. 6 and 6A, the infrared camera 22 or an operative portion of the infrared camera 22 (i.e. lens or window) may be mounted to the polishing platen 16. In the illustrative embodiment the top surface of the infrared camera 22 is generally flush or slightly below a top surface of the polishing pad 18 and faces the wafer 10. During operation of the chemical mechanical planarization apparatus 14, the wafer 10 is moved by the wafer carrier 20 across the polishing platen 18 and the surface of the wafer 10 moves across the infrared camera 22 in close proximity to the camera 22. As shown in FIG. 6 and 6A the infrared camera 22 may include an operative portion or lens mounted from the center of the polishing platen 18 and extending to the outer periphery thereof so that the wafer 10 is continuously scanned by the camera 22 during the (CMP) process. Alternately an infrared camera 22 may include a generally circular operative portion 22', as denoted in dotted lines in FIG. 6, that periodically contacts or focuses on any portion of the wafer 10. The operative portion 22' of the infrared camera may be as large as the whole wafer and can continuously (i.e. video) or periodically (i.e. photograph) scan the wafer 10 to develop an infrared image of the wafer surface. The polishing platen 18 may also be periodically stopped and the wafer 10 aligned with the operative portion 22' of the infrared camera 22.

In general an infrared camera 22 detects infrared waves emitted from an object and correlates this information to the heat of the object. With this arrangement the relative temperature at any point in the wafer 10 can be detected and mapped and an infrared image of the surface of the wafer developed. This information can then be analyzed to control the (CMP) process and to detect the endpoints of different materials on the wafer.

As will be apparent to one skilled in the art such infrared cameras 22 are commercially available. One such commercially available infrared camera 22 is disclosed in reference [2]. Such an infrared camera 22 may be used to display an image on a TV monitor as disclosed in reference [1] or the information may be analyzed directly by a computer and used with appropriate manual or automated circuitry to control the operational parameters of the (CMP) process. The mounting of the infrared camera 22 or 22' on the polishing platen 18 will depend on the exact configuration of the camera 22 or 22'. An infrared camera 22 may also be mounted to other components of the (CMP) apparatus, provided that the surface of the wafer 10 is accessible to an operative portion of the infrared camera 22. Additionally, it is contemplated that heat detection means other than an infrared camera 22 may be utilized to develop an infrared image of the wafer.

The output of the infrared camera 22 is coupled to a control means 24 (FIG. 6) that analyzes the data and uses signals generated by the infrared camera 22 to control the operational parameters of the mechanical planarization apparatus 14. As an example, friction and thus the temperature of the wafer 10 may increase as one layer such as an oxide is removed and another layer such as a metal film is contacted. The endpoint of the layers can thus be detected. The temperature at different points of the wafer 10 may also be different corresponding to different material layers or structural configurations. The parameters of the chemical mechanical planarization (CMP) process can be adjusted using this information to properly process the wafer 10 as required. A more uniform (CMP) process can thus be achieved. In addition the endpoints of different materials on the wafer can be detected.

With reference to FIG. 7, the method of the invention is shown and can be summarized by the steps of:

processing a wafer by chemical mechanical planarization (CMP), step 30;

detecting a temperature of the wafer using an infrared camera to develop an infrared image of the wafer step 32; and controlling parameters of the (CMP) process using the infrared image of the wafer, step 34.

One example of a use of the method and apparatus of the invention can be more fully explained with references to FIGS. 1 and 2. As the semiconductor wafer 10 is rotated and pressed against the pad 18 of the polishing platen 16, the oxide coating 12 (FIG. 1) of the wafer 10 contacts the surface of the pad 18 The oxide coating 12 has a hardness which produces a certain coefficient of friction by contact with the surface of the pad 18 and polishing agent 18. This coefficient of friction produces a certain temperature at different points of the wafer surface depending on the underlying films. An infrared image of the wafer 10 can thus be developed in real time during the (CMP) process.

The coefficient of friction between the wafer and polishing pad 16 and thus the infrared image of the wafer 10 may be generally constant until the oxide 12 is polished away to the point at which the surface of the IC devices is exposed (FIG. 2). At this point, the IC devices contact the surface of the polishing pad 18 of the polishing platen 16. In general, the IC devices may be formed of a harder material than the oxide coating 12 (for example, a metallic film may be contacted). A different coefficient of friction thus occurs between the surface of the wafer 10 and the surface of the polishing pad 18 of the polishing platen 16 and the temperature rises. The rise in temperature thus corresponds to the endpoint of the IC devices.

This rise in temperature can be detected by the infrared camera 22 and used to control the operational parameters of the (CMP) process. Such a rise in temperature may appear locally on the wafer where for instance the oxide coating 12 is completely removed. As will be apparent to one skilled in the art, the temperature or infrared image of the wafer can be processed and analyzed in a variety of ways to obtain a real time evaluation of the (CMP) process and to control the uniformity of a (CMP) process.

The invention thus provides a simple yet unobvious method and apparatus for detecting the temperature of a semiconductor wafer during a chemical mechanical planarization (CMP) process and for using this information to control the uniformity of the (CMP) process. While the method and apparatus of the invention has been described with reference to a preferred embodiment thereof, as will be apparent to those skilled in the art, certain changes and modifications can be made without departing from the scope of the invention as defined by the following claims.

References

[1] Vipul Patel, Walter Kosnonocky, S. Ayyagari, and Mehul Patel, "Application of thermal imaging methodology for plasma etching diagnosis", SPIE's Technical Symposium on Microelectronic Processing Integration '91.

[2] D. J. Sauer, F. V. Shallcross, F. L. Hsueh, G. M. Meray, P. A. Levine, H. R. Gilmartin, T. S. Villani, B. J. Esposito, and J. R. Tower, "640×480 MOS PtSi IR Sensor" SPIE conference San Diego, July 1991.

We claim:

1. A method for controlling a chemical mechanical planarization (CMP) process for a semiconductor wafer comprising:
   detecting and mapping temperatures of the wafer during the (CMP) process to develop an infrared image of the wafer in real time;
   controlling process parameters of the (CMP) process using the infrared image of the wafer.

2. The method as recited in claim 1 and wherein:
   the temperature of the wafer is detected with an infrared camera.

3. The method as claimed in claim 2 and wherein:
   endpoints are detected when a temperature rise of the wafer occurs and a first material on the wafer is removed and a different material is contacted.

4. A method of controlling operational parameters of a chemical mechanical planarization (CMP) process for a semiconductor wafer and for detecting endpoints of different layers on the wafer in order to control a uniformity of the (CMP) process, comprising:
   rotating the wafer against a polishing platen;
   detecting a temperature of the wafer during the (CMP) process using an infrared camera and developing an infrared image of the wafer in real time such that an endpoint of materials on the wafer is determined by a temperature rise; and
   controlling the operational parameters of the (CMP) process by analyzing the infrared image.

5. The method as recited in claim 4 and wherein:
   the infrared camera is mounted to the polishing platen to scan a front side of the wafer.

6. The method as recited in claim 5 and wherein:
   the infrared camera is mounted from a center of the polishing platen to an outer periphery thereof to continuously scan the wafer during rotation of the polishing platen.

7. The method as recited in claim 5 and wherein:
   the infrared camera is mounted to the polishing platen to periodically scan the wafer.

* * * * *